United States Patent [19]
Aikawa et al.

[11] Patent Number: 4,899,066
[45] Date of Patent: Feb. 6, 1990

[54] OR-TYPE CMOS LOGIC CIRCUIT WITH FAST PRECHARGING

[75] Inventors: Masatoshi Aikawa; Hiromasa Nakagawa; Tsunenori Umeki, all of Itami, Japan

[73] Assignee: Mitsubishi Denki Kabushiki Kaisha, Tokyo, Japan

[21] Appl. No.: 848,563

[22] Filed: Apr. 7, 1986

[30] Foreign Application Priority Data

Jun. 20, 1985 [JP] Japan .................................. 60-135333

[51] Int. Cl.$^4$ ................. H03K 19/017; H03K 19/094; G11C 7/00; G11C 11/40
[52] U.S. Cl. .................................. 307/45.2; 365/203; 365/204; 365/104; 307/585
[58] Field of Search ................. 365/104, 103, 94, 203, 365/205, 207, 208, 185, 204, 230; 307/449, 463, 468, 469, 448, 451, 445, 452, 453, 585

[56] References Cited

U.S. PATENT DOCUMENTS 4,592,021  5/1986  Suzuki et al. ........................ 365/104

FOREIGN PATENT DOCUMENTS 0105394  8/1981  Japan .................................... 365/104
0186196  10/1984 Japan .................................... 365/104
0040600  3/1985  Japan .................................... 365/104

OTHER PUBLICATIONS

"Introduction to MOS LSI Design", J. Mavor et al, published by University of Edinburgh & translated into Japanese by T. Sugano & published by Sangyo Tosyo Co., Ltd., Apr. 1984, pp. 124–125.

Primary Examiner—Stuart N. Hecker
Assistant Examiner—Glenn A. Gossage
Attorney, Agent, or Firm—Lowe, Price, LeBlanc, Becker & Shur

[57] ABSTRACT

A complementary metal oxide semiconductor logic circuit comprises a signal line OR-connecting a plurality of MOS transistors which are turned on/off by a plurality of decoder outputs. The signal line is divided by a MOS-FET in two portions including a portion on an output side provided with an inverter and an OR-connected transistors side, so that respective portions of the signal line as divided are precharged by separate precharging MOS transistors.

4 Claims, 3 Drawing Sheets

INTEGRATED CIRCUIT

OR-TYPE CMOS LOGIC CIRCUIT WITH FAST PRECHARGING

BACKGROUND OF THE INVENTION

1. Field of the Invention

The present invention relates to a CMOS (complementary metal oxide semiconductor) transistor circuit, and more particularly, it relates to improvement in the operation characteristic of an OR-type ROM circuit formed of CMOS transistors.

2. Description of the Prior Art

FIG. 1 shows an example of a conventional OR-type ROM circuit which is formed by CMOS transistors. Referring to FIG. 1, the conventional OR-type ROM circuit includes n-channel MOS transistors $T_1$ to $T_n$ for receiving address signals from address decoder circuits $D_1$ to $D_n$ at respective gates thereof through respective word lines $x_1$ to $x_n$. The drains of the n-channel MOS transistors $T_1$ to $T_n$ are commonly connected with each other while the respective sources thereof are connected to ground potentials G.

Provided between a signal line to which the drains of the n-channel MOS transistors $T_1$ to $T_n$ are commonly connected and a power supply V is a p-channel MOS transistor $PT_1$ which receives clock signals $\phi$ at its gate to be turned on/off for precharging a node B. Between the node B and an output terminal, provided are an inverter I for amplification which receives the signal level of the node B, and a p-channel MOS transistor $PT_2$ for stabilizing the potential of the node B, and for ensuring high speed operation of the $V_{OUT}$. The drain of the p-channel MOS transistor $PT_2$ is connected to the node B and the source thereof is connected to the power supply V, while its gate receives output signals from the inverter I.

The address decoder circuits $D_1$ to $D_n$ are respectively formed of AND-type decoder circuits. Namely, each of the address decoder circuits $D_1$ to $D_n$ includes n-channel MOS transistors $DN_2$ to $DN_y$ for receiving address signals $AD_i (i=2\sim y)$ at the gates thereof and an n-channel MOS transistor $DN_1$ for receiving the clock signal $\phi$ at its gate. The source and drain terminals of the n-channel MOS transistors $DN_1$ to $DN_y$ are alternately connected with each other while the source terminal of the n-channel MOS transistor $DN_1$ is connected to the ground potential G to form an AND-type domino circuit. Provided between the drain of the n-channel MOS transistor $DN_2$ and the power supply V is a p-channel MOS transistor $DP_1$ for receiving the clock signal $\phi$ at its gate. Signals from the junction of the n-channel MOS transistor $DN_2$ and the p-channel MOS transistor $DP_1$ are outputted through an inverter DI onto a signal line (word line) $x_i$ to be an address decoded signal. Between the input portion of the inverter DI and the power supply V, provided is a p-channel MOS transistor $DP_2$ which receives output signals from the inverter DI at its gate for ensuring high-speed operation of the decoder.

In the circuit configuration as shown in FIG. 1, address signals are supplied at each gate of the n-channel MOS transistors $DN_2$ to $DN_y$ in the address decoder circuits $D_1$ to $D_n$ to be decoded therein so that output signals $V_{OUT}$ of the inverter I are to be output signals from the ROM circuit for selecting, e.g., a word line selected by address signals.

FIG. 2 is a timing chart showing the operational timing of the circuit as shown in FIG. 1. With reference to FIGS. 1 and 2, the operation of this circuit is now described.

During a period $T_1$ when the clock signals $\phi$ are at "L" levels, the p-channel MOS transistors $DP_1$ and $PT_1$, which receive the clock signals $\phi$ at the gates thereof, enter ON states. The clock signals $\phi$ are also supplied to the gate of the n-channel MOS transistor $DN_1$ in each of the decoder circuits $D_1$ to $D_n$, and hence, at this time, the n-channel MOS transistor $DN_1$ enters an OFF state and the potential of the junction of the p-channel transistor $DP_1$ and the n-channel MOS transistor $DN_2$ is turned into an "H" level. Therefore, "L" level signals are supplied onto the signal line $x_i$ ($i=1$ to n) through the inverter DI, which receives the said "H" signals. All of the n-channel MOS transistors $T_1$ to $T_n$, which receive the signals from the decoder circuits $D_1$ to $D_n$ at the gates thereof, enter OFF states while the node B is precharged to an "H" level potential by voltage from the power supply V through the p-channel MOS transistor $PT_1$, which is in turn in an ON state. The potential of the node B is supplied to the inverter I, whereby the level of the output $V_{OUT}$ is turned to an "L" level.

Then, during a period $T_2$ when the clock signal $\phi$ is at an "H" level, both of the p-channel MOS transistors $DP_1$ and $PT_1$ enter OFF states while the n-channel MOS transistor $DN_1$ enters an ON state. The n-channel MOS transistors $DN_2$ to $DN_y$ of the respective decoder circuits $D_1$ to $D_n$ are supplied with the address signals $AD_i$ at the gates thereof, whereby signals corresponding to the address signals $AD_i$ appear on the signal lines $x_1$ to $x_n$ from the address decoder circuits $D_1$ to $D_n$. The decoder circuits $D_1$ to $D_n$ receive addresses in different combinations such that the decoder circuit $D_1$ receives $AD_1$, $AD_2$ and $AD_3$, the decoder circuit $D_2$ receives $AD_1$, $AD_2$ and $\overline{AD_3}$, ..., in case of three-bit addresses, for example. Therefore, when all of the received address signals $AD_i$ are at "H" levels, the decoder circuit outputs "H" signals while outputting "L" signals when at least one of the received address signals $AD_i$ is at an "L" level, since the input portion of the inverter DI is precharged at an "H" level. The respective gates of the n-channel MOS transistors $T_1$ to $T_n$ are supplied with the signals from the address decoder circuits $D_1$ to $D_n$, so that the respective n-channel MOS transistors $T_1$ to $T_n$ are turned on/off in response to the address decode signals as received. The p-channel MOS transistor $PT_1$ for receiving the clock signals $\phi$ in its gate is in an OFF state at this time, and hence, when an n-channel MOS transistor $T\alpha$ for receiving "H" signals at its gate enters an ON state, the potential of the node B is discharged through the n-channel MOS transistor $T\alpha$ which is in the ON state, to be turned to an "L" level. Thus, the output $V_{OUT}$ from the inverter I is turned on an "H" level.

When the clock signal $\phi$ is again turned to "L" level, similar operation is repeated to precharge the node B up to "H" level. At this time, the p-channel MOS transistor $DP_2$ included in each of the address decoder circuits $D_1$ to $D_n$ receives the output from the inverter DI and operates at a high speed to change the potential of the input part of the inverter DI at a high speed, thereby to decrease the through-current from the power supply to the ground potential at the inverter DI.

Then, during a period $T_3$ when the clock signal $\phi$ is at "H" level, the node B is held at an "H" level of the precharge level and the output $V_{OUT}$ is maintained at an "L" level when no address is selected and all of the outputs from the decoder circuits $D_1$ to $D_n$ are at "L" levels.

In the conventional OR-type ROM circuit as shown in FIG. 1, the clock signals $\phi$ are changed from "H" to "L" levels to precharge the potential of the node B from the "L" level to the "H" level through only one p-channel MOS transistor $PT_1$. Therefore, a considerable long time is required to stabilize the potential of the node B at the "H" level, whereby the through-current from the power supply to the ground potential in the inverter I is increased followed by increase in power dissipation, while response operation of the outputs from the inverter I is retarded.

In proportion to increase in number of the n-channel MOS transistors $T_1$ to $T_n$, stray capacitance in the signal lines and parasitic capacitance of the MOS transistors or the like are increased to enlarge the aforementioned disadvantages.

An AND-connected CMOS logic circuit is disclosed in "Introduction to MOS LSI Design" by J. Mavor et al., published by University of Edinburgh and translated into Japanese by T. Sugano and published by Sangyo Tosyo Co. Ltd., April 1984, pp. 124–125. However, the aforementioned problems are not particularly caused in the AND-connected CMOS logic circuit.

SUMMARY OF THE INVENTION

Accordingly, an object of the present invention is to overcome the aforementioned disadvantages of the prior art and provided a CMOS transistor circuit which can respond to charging to a precharge level at a high speed while the through-current in an inverter I is decreased and power dissipation is reduced.

In a CMOS transistor circuit according to the present invention for forming an OR-type ROM circuit, a signal line to be precharged is divided by a first MOS transistor into two portions including a portion connected with decoder transistors and another portion while, second MOS transistors are provided for precharging the respective ones of the two signal lines as divided.

According to the present invention, a first MOS transistor for dividing a signal line into two portions upon precharging is turned off while the respective ones of the two signal lines divided by the first MOS transistor are precharged by each of the two second MOS transistors so that particularly the signal line between the first MOS transistor for dividing and an input inverter and an output line of the output inverter can be precharged at a higher speed in comparison with the conventional case, whereby the through-current is decreased and power dissipation is reduced, with improved high-speed responsibility.

These and other objects, features, aspects and advantages of the present invention will become more apparent from the following detailed description of the present invention when taken in conjunction with the accompanying drawings.

DESCRIPTION OF THE PREFERRED EMBODIMENT

An embodiment of the present invention is now described with reference to the accompanying drawing.

Figure 1:
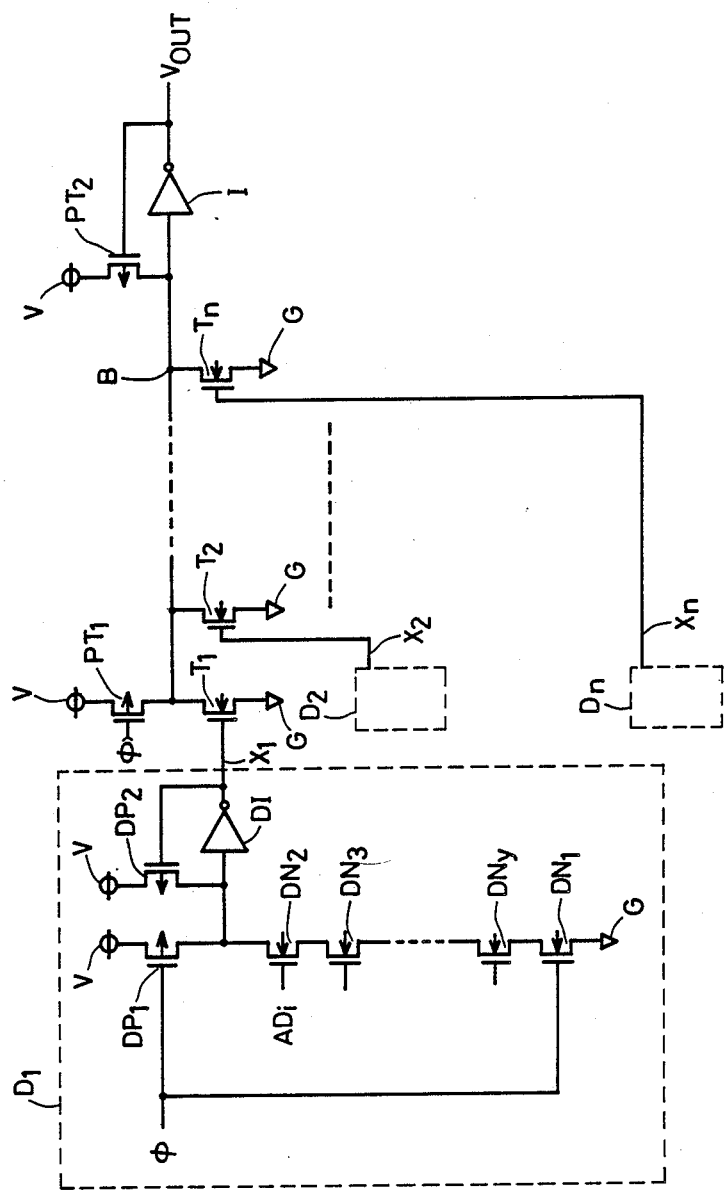
FIG. 1 is a circuit diagram showing the configuration of a conventional OR-type ROM circuit.
Figure 3:
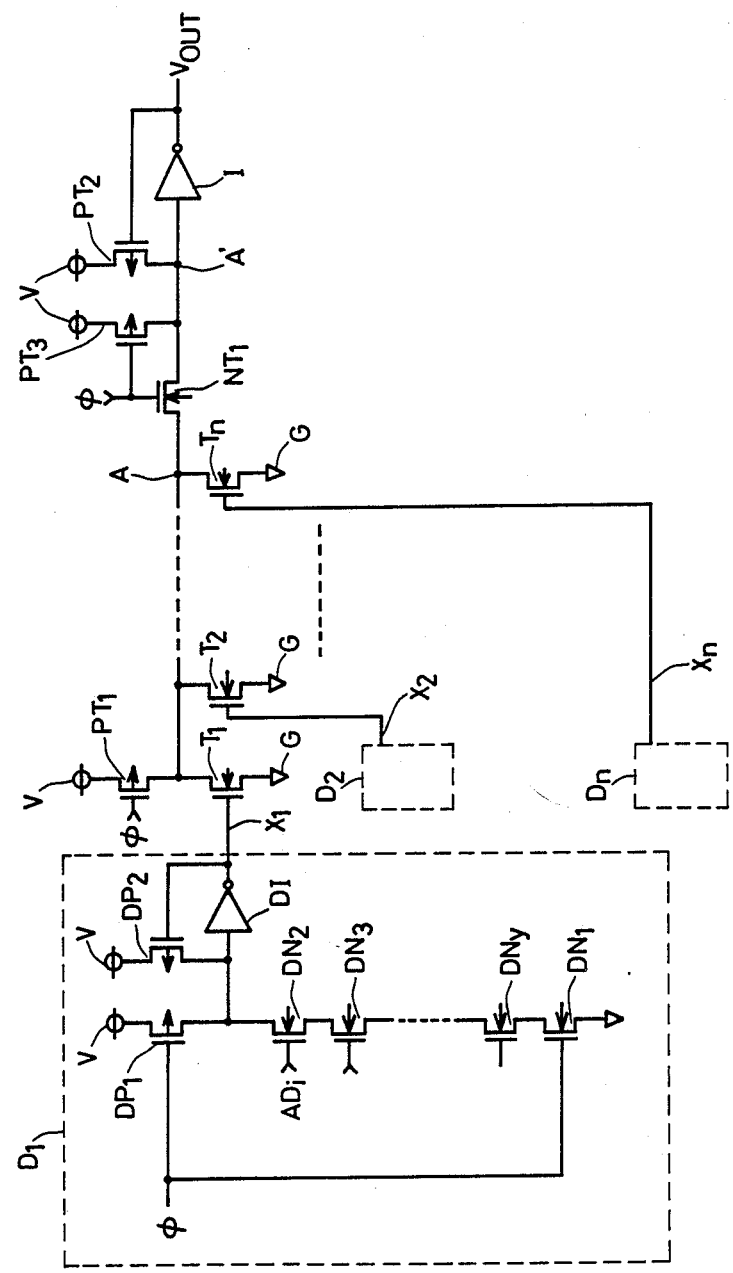
FIG. 3 shows the configuration of an OR-type ROM circuit according to an embodiment of the present invention.

FIG. 3 shows the configuration of a CMOS transistor circuit according to an embodiment of the present invention, which forms an OR-type ROM circuit for selecting, e.g, a word line. Referring to FIG. 3, the feature of the present invention, which is different from that of the conventional circuit as shown in FIG. 1, resides in that provided are an n-channel MOS transistor $NT_1$ for dividing a signal line into two portions upon precharging the signal line and a p-channel MOS transistor $PT_3$ for precharging one of the two signal lines divided by the n-channel MOS transistor $NT_1$, which signal line is on the side of an output line. One conduction terminal of the n-channel MOS transistor $NT_1$ is connected to commonly-connected drains of n-channel MOS transistors $T_1$ to $T_n$ through a node A and the other conduction terminal thereof is connected to the input part of an inverter I through a node A', while the gate thereof receives clock signals $\phi$.

With respect to a second p-channel MOS transistor $PT_3$ for precharging, one conduction terminal thereof is connected to the other conduction terminal of the n-channel MOS transistor $NT_1$ and the input part of the inverter I and the other conduction terminal thereof is connected to a power supply V while the gate thereof receives the clock signals $\phi$. Description is now made on the operation of this circuit.

Figure 2:
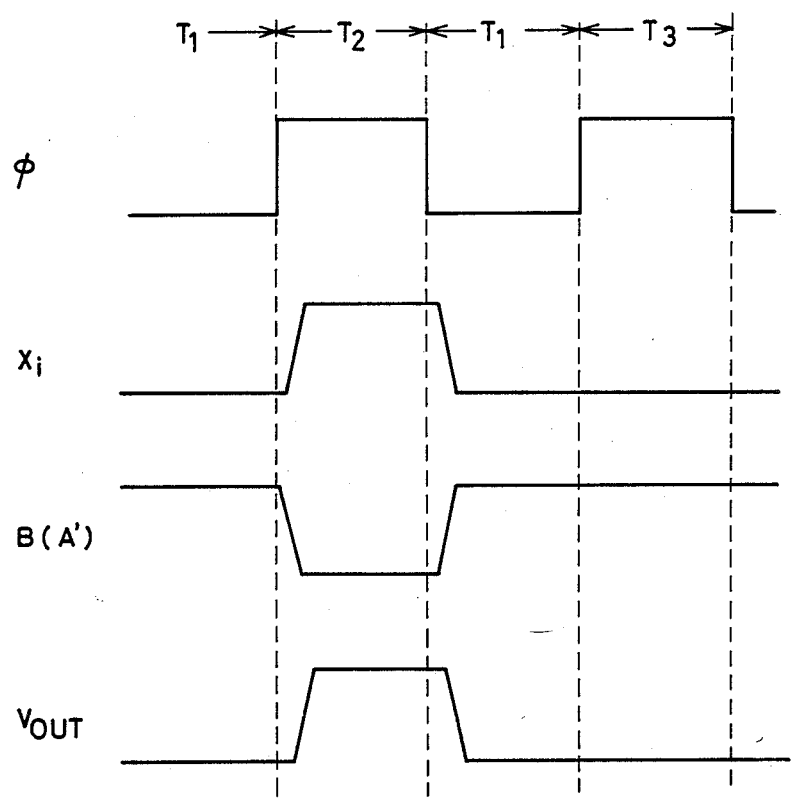
FIG. 2 is a signal waveform diagram showing operation of the conventional OR-type ROM circuit.

When the clock signal $\phi$ is at "H" level, the n-channel MOS transistor $NT_1$ is in an ON state and the p-channel MOS transistor $PT_3$ is in an OFF state, and hence output signal $V_{OUT}$ corresponding to address signals $AD_i$ (e.g., row addresses) is outputted in the periods $T_2$ and $T_3$ as shown in FIG. 2, similarly to the conventional case.

In a precharge period (period $T_1$ in FIG. 2) when the clock signal $\phi$ is at "L" level, the n-channel MOS transistor $NT_1$ enters an OFF state, whereby the node A is completely electrically cut off from the node A' and the respective signal lines are precharged by the respective p-channel MOS transistors $PT_1$ and $PT_3$. The node A' is completely electrically cut off from the node A by the n-channel MOS transistor $NT_1$ at this time, and hence the same can precharge the signal line at a high speed with no influence exerted by parasitic capacitance at the n-channel MOS transistors $T_1$ to $T_n$ or the like. Thus, the input of the inverter I is turned to an "H" level at a high speed with an effect by a p-channel MOS transistor $PT_2$, $PT_3$ (especially $PT_3$) while the through-current thereof is reduced in comparison with the conventional case and the power dissipation therein is also reduced, and, further, the output signal $V_{OUT}$ can respond to the clock signal $\phi$ at a high speed.

Although the decoder circuits $D_1$ to $D_n$ are formed of AND-type domino circuits in the aforementioned embodiment, the circuit configurations thereof are not restricted to the same.

According to the present invention as hereinabove described, the CMOS transistor circuit forming the conventional OR-type ROM circuit is provided with a first MOS transistor for electrically dividing a signal line to be precharged into two portions and a second MOS transistor for precharging one, on the output side, of the signals lines as divided, whereby obtained is a CMOS transistor circuit forming an OR-type ROM circuit which is in simple structure with smaller power dissipation in comparison with the conventional circuit and capable of high speed operation. Further, the circuit of the present invention can be embodied within a variety of readily available electronic apparatus, including, for example, integrated circuits.

Although the present invention has been described and illustrated in detail, it is clearly understood that the same is by way of illustration and example only and is not to be taken by way of limitation, the spirit and the scope of the present invention being limited only by the terms of the appended claims.

What is claimed is:

1. An OR-type CMOS logic circuit with fast precharging comprising:
   a single data line having a first portion and a second portion;
   a plurality of MOS transistors connected to said first portion of said single data line in a wired OR manner, said plurality of MOS transistors operative in response to address decode signals;
   inverter means connected to said second portion of said single data line for outputting a signal on said second portion of said single data line;
   an MOS transistor connected to the input of said inverter for stabilizing an input signal of said inverter means, said MOS transistor operative in response to the output of said inverter;
   a first precharging MOS transistor connected to said first portion of said single data line for precharging said first portion of said single data line to a predetermined level in response to a precharging signal;
   a second precharging MOS transistor connected to said second portion of said single data line for precharging said second portion of said single data line to said predetermined level in response to said precharging signal; and
   an isolating MOS transistor interposed between said first and second portions of said single data line for isolating said first portion of said single data line from said second portion of said single data line in response to said precharging signal.

2. A CMOS logic circuit in accordance with claim 1, wherein said first precharging MOS transistor comprises an n-channel MOS field effect transistor.

3. A CMOS logic circuit in accordance with claim 1, wherein said second precharging MOS transistor comprises a p-channel MOS field effect transistor.

4. A CMOS logic circuit in accordance with claim 1, wherein said CMOS logic circuit is formed on a semiconductor integrated circuit device.

* * * * *